United States Patent
Sawazaki et al.

(10) Patent No.: US 6,861,663 B2
(45) Date of Patent: Mar. 1, 2005

(54) GROUP III NITRIDE COMPOUND SEMICONDUCTOR LIGHT-EMITTING DEVICE

(75) Inventors: Katsuhisa Sawazaki, Nishikasugai-gun (JP); Makoto Asai, Ama-gun (JP); Naoki Kaneyama, Inazawa (JP)

(73) Assignee: Toyoda Gosei Co., Ltd., Nishikasugi-gun (JP)

(*) Notice: Subject to any disclaimer, the term of this patent is extended or adjusted under 35 U.S.C. 154(b) by 0 days.

(21) Appl. No.: 09/522,832

(22) Filed: Mar. 10, 2000

(65) Prior Publication Data

US 2002/0056836 A1 May 16, 2002

(30) Foreign Application Priority Data

Mar. 31, 1999 (JP) ............................................ 11-090719

(51) Int. Cl.[7] .............................................. H01L 33/00
(52) U.S. Cl. ........................ 257/13; 257/103; 257/190; 977/DIG. 1
(58) Field of Search ................................. 257/103, 190, 257/94, 96, 97, 12–15, 17, 22; 977/DIG. 1; 372/45, 46

(56) References Cited

U.S. PATENT DOCUMENTS

| | | | |
|---|---|---|---|
| 5,777,350 A | * 7/1998 | Nakamura et al. | 257/96 |
| 5,889,806 A | 3/1999 | Nagai et al. | 372/45 |
| 5,959,307 A | * 9/1999 | Nakamura et al. | 257/14 |
| 6,040,588 A | 3/2000 | Koide et al. | 257/15 |
| 6,100,545 A | * 8/2000 | Chiyo et al. | 257/98 |
| 6,153,010 A | * 11/2000 | Kiyoku et al. | 117/95 |

FOREIGN PATENT DOCUMENTS

| | | |
|---|---|---|
| EP | 0 716 457 A2 | 6/1996 |
| EP | 0 772 249 A2 | 5/1997 |
| EP | 0 908 988 A2 | 4/1999 |
| EP | 1 017 113 A1 | 7/2000 |
| EP | 1 022 825 A | 7/2000 |
| JP | 09-008412 | 1/1997 |
| JP | 09-036430 | 2/1997 |
| JP | 2735057 | 1/1998 |
| JP | 10-135514 | 5/1998 |
| JP | 10-256657 | 9/1998 |
| JP | 11-074621 | 3/1999 |
| WO | WO98/31055 | 7/1998 |
| WO | WO98/39827 | 9/1998 |

OTHER PUBLICATIONS

Japanese Office Action mailed Feb. 24, 2004, with concise statement of relevance in English.
European Search Report for Application No. 00105047.5-2203, dated Jan. 31, 2002.
XP-000784116, J. Han et al., "AlGaN/GaN quantum well ultraviolet light emitting diodes", Applied Physics Letters, vol. 73, No. 12, Sep. 21, 1998, pp. 1688–1690.
XP-000735941, Shuji Nakamura, "GaN-Based Blue/Green Semiconductor Laser", IEEE Journal of Selected Topics in Quantum Electronics, vol. 3., No. 2, Apr. 1997, pp. 435–442.

* cited by examiner

*Primary Examiner*—Bradley Baumeister
(74) *Attorney, Agent, or Firm*—McGinn & Gibb, PLLC

(57) ABSTRACT

A buffer layer of aluminum nitride (AlN) about 25 nm thick is provided on a sapphire substrate. An $n^+$ layer of a high carrier density, which is about 4.0 $\mu$m thick and which is made of GaN doped with silicon (Si), is formed on the buffer layer. An intermediate layer of non-doped $In_xGa_{1-x}N$ (0<x<1) about 3000 Å thick is formed on the high carrier density $n^+$ layer. Then, an n-type clad layer of GaN about 250 Å thick is laminated on the intermediate layer. Further, three well layers of $Ga_{0.8}In_{0.2}N$ about 30 Å thick each and two barrier layers of GaN about 70 Å thick each are laminated alternately on the n-type clad layer to thereby form a light-emitting layer of a structure with two multilayer quantum well (MQW) cycles.

26 Claims, 2 Drawing Sheets

GROUP III NITRIDE COMPOUND SEMICONDUCTOR LIGHT-EMITTING DEVICE

BACKGROUND OF THE INVENTION

1. Field of the Invention

The present invention relates to a group III nitride compound semiconductor light-emitting device of high light intensity.

The present application is based on Japanese Patent Application No. Hei. 11-90719, which is incorporated herein by reference.

2. Description of the Related Art

FIG. 2 is a sectional view showing a structure of a group III nitride compound semiconductor light-emitting device 200 according to related art.

The group III nitride compound semiconductor light-emitting device 200 is representative of light-emitting devices of the type having layers of group III nitride semiconductors laminated on a substrate.

The group III nitride compound semiconductor light-emitting device 200 comprises a sapphire substrate 11 as a substrate, a buffer layer 12 of aluminum nitride (AlN) laminated on the sapphire substrate 11, an n$^+$ layer 13 of a high carrier density formed of GaN doped with silicon (Si) and laminated on the buffer layer 12, an intermediate layer 14 laminated on the n+ layer 13, an n-type clad layer 15 of GaN laminated on the intermediate layer 14, a light-emitting layer 16 of a multilayer quantum well structure (MQW) laminated on the n-type clad layer 15 and composed of alternately laminated well layers 161 of GaInN and barrier layers 162 of GaN, a p-type clad layer 18 of p-type AlGaN laminated on the p-type clad layer, and a p-type contact layer 19 of p-type GaN laminated on the p-type clad layer.

In the aforementioned light-emitting device 200, the barrier layers 162 are made substantially uniform in thickness so as to be generally in a range of 70 to 80 Å. Moreover, from the point of view of improvement in color purity, the intermediate layer 14 of InGaN is provided, and the n-type clad layer 15 having the same thickness and composition as each of the barrier layers 162 is also formed.

In the group III nitride compound semiconductor light-emitting device such as the aforementioned light-emitting device 200, or the like, there is a problem in that the effect of confining carriers in the light-emitting layer 16 against the high carrier density n$^+$ layer 13 is unable to be obtained sufficiently because the thickness of the n-type clad layer 15 under the light-emitting layer 16 is substantially equal to the thickness of each of the barrier layers 162, and therefore light-emitting efficiency is low in spite of very good color purity.

SUMMARY OF THE INVENTION

The present invention is designed to solve the aforementioned problem and an object thereof is to provide a light-emitting device of high light intensity by securing the effect of confining carriers in the light-emitting layer against the high carrier density n$^+$ layer sufficiently while keeping color purity intact.

Another object of the present invention is to provide a light-emitting device of higher light intensity by the synergistic effect of an n-type clad layer and an intermediate layer according to the present invention to bring the aforementioned carrier confinement effect.

To solve the aforementioned problem, the following means are effective.

That is, a first means, which is applied to a group III nitride compound semiconductor light-emitting device comprising a light-emitting layer of a multilayer quantum well structure composed of alternately laminated well layers and barrier layers, is in that the device further comprises an n-type clad layer which is provided to be in contact with the light-emitting layer and which is made thicker than each of the barrier layers.

A second means, which is applied to the first means, is in that the thickness of the n-type clad layer is set to be not smaller than 100 Å.

A third means, which is applied to the first means, is in that the thickness of the n-type clad layer is set to be not larger than 500 Å.

A fourth means, which is applied to any one of the first, second and third means, is in that the device further comprises an intermediate layer which is provided so as to be in contact with a face of the n-type clad layer opposite to the light-emitting layer.

A fifth means, which is applied to any one of the first, second, third and fourth means, is in that the intermediate layer is formed of $In_xGa_{1-x}N$ ($0 \leq x \leq 1$).

A sixth means, which is applied to any one of the first, second, third and fourth means, is in that the intermediate layer is formed of $In_xGa_{1-x}N$ ($0.01 \leq x \leq 0.05$).

The aforementioned problem can be solved by the above means.

According to the means of the present invention, carriers contributing to light emission can hardly run away from the light-emitting layer 16 toward the high carrier density n$^+$ layer 13 because the n-type clad layer 15 thicker than each of the barrier layers is formed to be in contact with the light-emitting layer 16 of the multilayer quantum well structure. That is, the carrier confinement effect can be obtained sufficiently by the n-type clad layer 15, so that light-emitting efficiency is improved.

Further, the thickness of the n-type clad layer 15 is preferably not smaller than 100 Å, more preferably in a range of from 150 to 500 Å. If the thickness is smaller than 100 Å, it is difficult to confine carriers in the light-emitting layer securely because the thickness is too small. If the thickness is contrariwise larger than 500 Å, the color purity is worsened. Also from the point of view of productivity, the thickness of the n-type clad layer 15 is preferably not larger than 500 Å.

When an intermediate layer is further provided just under the n-type clad layer, a light-emitting device of higher light intensity can be achieved. GaInN is preferably used as a semiconductor for forming the intermediate layer.

Further, the light emission intensity of the light-emitting device has a strong correlation with the composition ratio x of indium (In) in the intermediate layer of $In_xGa_{1-x}N$. The light emission intensity of the light-emitting device 100 has an acute peak when the composition ratio x of indium (In) is about 0.03. Hence, the light-emitting device 100 exhibits high light intensity when x is in a range of "$0.01 \leq x \leq 0.05$".

If the composition ratio x of indium is smaller than 0.01, the light emission intensity is lowered. If the composition ratio x of indium is contrariwise larger than 0.05, the crystallinity of the intermediate layer deteriorates because the amount of indium is too large. As a result, semiconductor layers laminated after the intermediate layer cannot be formed with good quality, so that light emission intensity is lowered.

Incidentally, the group III nitride compound semiconductor according to the present invention is represented by the general formula $Al_xGa_yIn_{1-x-y}N$ ($0 \leq x \leq 1$, $0 \leq y \leq 1$, $0 \leq x+y \leq 1$), which may further contain group III elements such as boron (B) and thallium (Tl) and in which the nitrogen (N) may be replaced by phosphorus (P), arsenic (As), antimony (Sb) or bismuth (Bi). Accordingly, each of the layers such as the buffer layer, the barrier layers, the well layers, the clad layers, the contact layer, the intermediate layer, the cap layer, etc. in the group III nitride compound semiconductor light-emitting device may be formed of quaternary, ternary or binary $Al_xGa_yIn_{1-x-y}N$ ($0 \leq x \leq 1$, $0 \leq y \leq 1$, $0 \leq x+y \leq 1$) of an optional crystal mixture ratio such as AlGaN, InGaN, or the like.

Features and advantages of the invention will be evident from the following detailed description of the preferred embodiments described in conjunction with the attached drawings.

DETAILED DESCRIPTION OF THE PREFERRED EMBODIMENTS

The present invention will be described below on the basis of a specific embodiment thereof.

Figure 1:
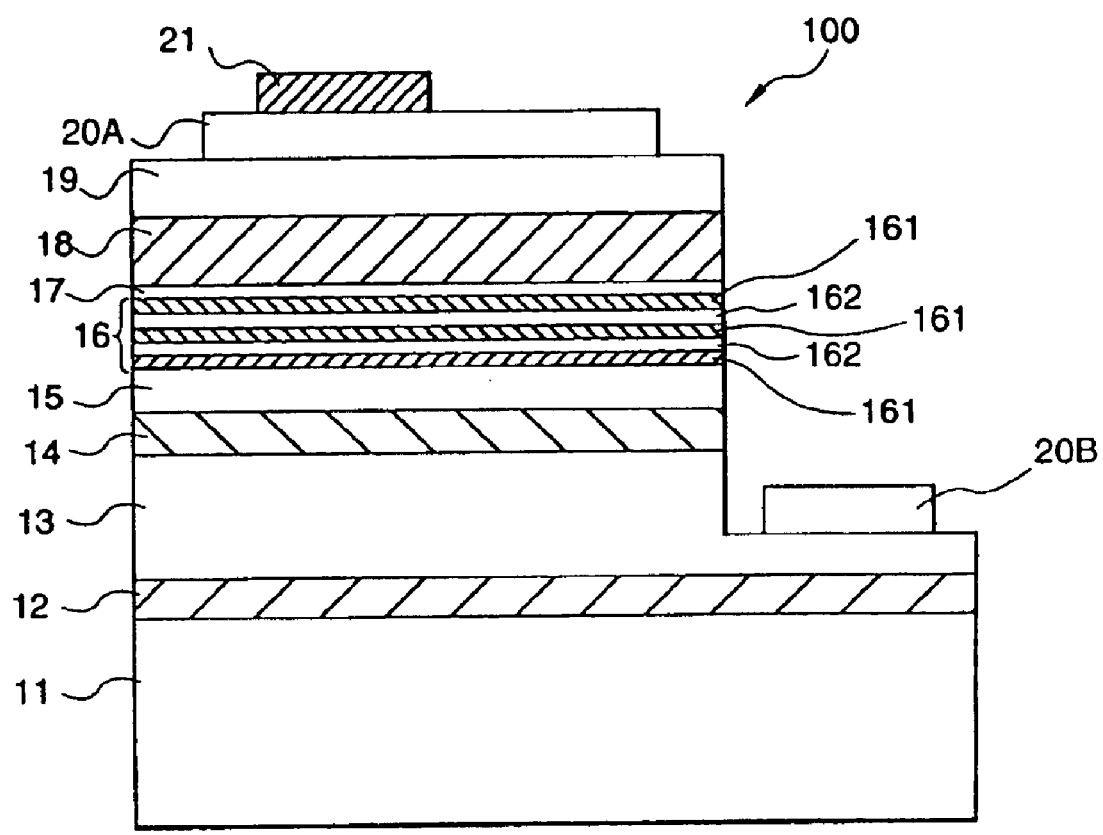
FIG. 1 shows a typical sectional view showing the structure of a group III nitride compound semiconductor light-emitting device 100 according to a specific embodiment of the present invention.
Figure 2:
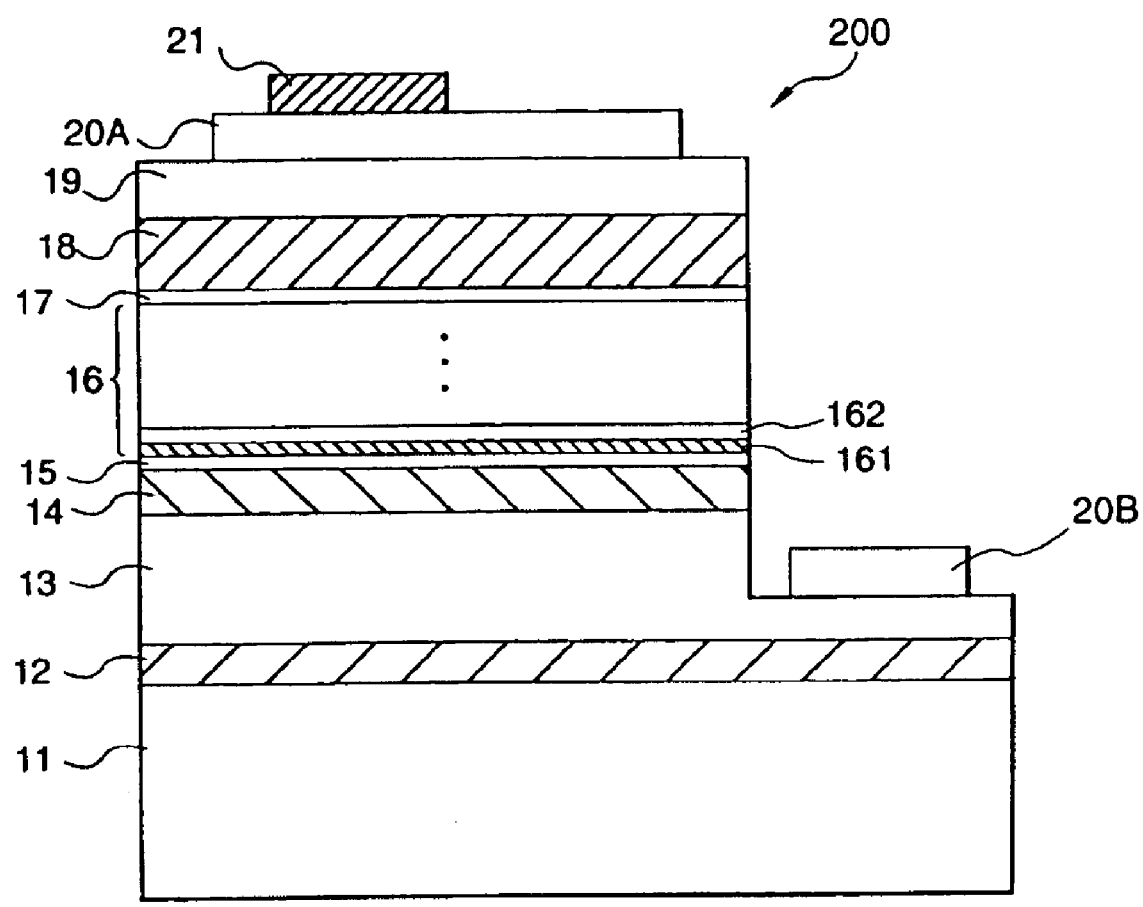
FIG. 2 shows a sectional view showing the structure of a group III nitride compound semiconductor light-emitting device 200.

FIG. 1 is a typical sectional configuration view of a light-emitting device 100 constituted by group III nitride compound semiconductors formed on a sapphire substrate 11. A buffer layer 12 of aluminum nitride (AlN) about 25 nm thick is provided on the substrate 11. An $n^+$ layer 13 of a high carrier density, which is formed of GaN doped with silicon (Si) and which is about 4.0 µm thick, is formed on the buffer layer 12. An intermediate layer 14 of non-doped $In_xGa_{1-x}N$ ($0<x<1$) about 3000 Å thick is formed on the high carrier density $n^+$ layer 13.

Then, an n-type clad layer 15 of GaN about 250 Å thick is laminated on the intermediate layer 14. A light-emitting layer 16 of a multilayer quantum well structure (MQW), which is constituted by an alternate laminate of well layers 161 of $Ga_{0.8}In_{0.2}N$ about 30 Å thick each and barrier layers 162 of GaN about 70 Å thick each, is formed on the n-type clad layer 15. The number of the well layers 161 is three. The number of the barrier layers 162 is two. A cap layer 17 of GaN about 70 Å thick is formed on the light-emitting layer 16. A p-type clad layer 18 of p-type $Al_{0.12}Ga_{0.88}N$ about 300 Å thick is formed on the cap layer. A p-type contact layer 19 of p-type GaN about 100 nm thick is further formed on the p-type clad layer 18.

Further, a light-transparency positive electrode 20A is formed on the p-type contact layer 19 by metal evaporation whereas a negative electrode 20B is formed on the n+ layer 13. The light-transparency positive electrode 20A consists of a cobalt (Co) film about 15 Å thick to be joined to the p-type contact layer 19, and a gold (Au) film about 60 Å thick to be joined to the Co film. The negative electrode 20B consists of a vanadium (V) film about 200 Å thick, and an aluminum (Al) or Al alloy film about 1.8 µm thick. An electrode pad 21 about 1.5 µm thick, which is made of a combination of either Co or Ni, Au and Al or made of an alloy thereof, is formed on a part of the positive electrode 20A.

A method for producing the light-emitting device 100 will be described below.

The light-emitting device 100 was formed by vapor growth in accordance with a metal organic vapor phase epitaxy method (hereinafter abbreviated as "MOVPE"). The gasses used were ammonia ($NH_3$), carrier gas ($H_2$, $N_2$), trimethylgallium ($Ga(CH_3)_3$) (hereinafter referred to as "TMG"), trimethylaluminum ($Al(CH_3)_3$) (hereinafter referred to as "TMA"), trimethylindium ($In(CH_3)_3$) (hereinafter referred to as ("TMI"), silane ($SiH_4$), and cyclopentadienylmagnesium ($Mg(C_5H_5)_2$) (hereinafter referred to as "$CP_2Mg$").

First, a single-crystal substrate 11 having a face a cleaned by an organic cleaning process as a main face was attached to a susceptor placed in a reaction chamber of an MOVPE system. Then, the substrate 11 was baked at a temperature of 1100° C. while $H_2$ was introduced into the reaction chamber under normal atmospheric pressure.

Then, the temperature of the substrate 11 was decreased to 400° C. and $H_2$, $NH_3$ and TMA were supplied so that a buffer layer 12 of AlN about 25 nm thick was formed on the substrate 11.

Then, while the temperature of the substrate 11 was kept at 1150° C., $H_2$, $NH_3$, TMG, and silane were supplied so that a high carrier density $n^+$ layer 13 of GaN having a film thickness of about 4.0 µm and an electron density of $2 \times 10^{18}/cm^3$ was formed.

Then, the temperature of the substrate 11 was decreased to 850° C. and either $N_2$ or $H_2$, $NH_3$, TMG and TMI were supplied so that an intermediate layer 14 of $In_{0.03}Ga_{0.97}N$ about 3000 Å thick was formed.

After the intermediate layer 14 was formed, the temperature of the substrate 11 was kept at 850° C. and either $N_2$ or $H_2$, $NH_3$ and TMG was supplied so that an n-type clad layer 15 of GaN about 250 Å thick was formed.

Then, either $N_2$ or $H_2$, $NH_3$, TMG and TMI were supplied so that a well layer 161 of $Ga_{0.8}In_{0.2}N$ about 30 Å thick was formed. Then, a barrier layer 162 of GaN about 70 Å thick was formed in the same condition as used for forming the n-type clad layer 15.

Two well layers 161 and one barrier layer 162 were further formed alternately in the same condition as described above to thereby form a light-emitting layer 16 of an MQW structure. A cap layer 17 thicker than 70 Å was formed on the light-emitting layer 16 in the same condition as used for forming each of the barrier layers 162.

Then, the temperature of the substrate 11 was kept at 1150° C. and either $N_2$ or $H_2$, $NH_3$, TMG, TMA and $CP_2Mg$ were supplied so that a p-type clad layer 18, which was made of p-type $Al_{0.12}Ga_{0.88}N$ doped with magnesium (Mg) and which was about 300 Å thick, was formed.

Then, the temperature of the substrate 11 was kept at 1100° C. and either $N_2$ or $H_2$, $NH_3$, TMG and $CP_2Mg$ were supplied so that a p-type contact layer 19, which was made of p-type GaN doped with Mg and which was about 100 nm thick, was formed.

Then, an etching mask was formed on the p-type contact layer 19. After a predetermined region of the mask was removed, the non-masked portion of the p-type contact layer 19, the p-type clad layer 18, the light-emitting layer 16, the intermediate layer 14 and a part of the $n^+$ layer 13 were etched with a chlorine-containing gas by reactive etching to thereby expose a surface of the $n^+$ layer 13.

Then, a negative electrode 20B for the n+ layer 13 and a light-transparency positive electrode 20A for the p-type contact layer 19 were formed by the following procedure.

(1) After a photo resist was applied, a window was formed in a predetermined region in the exposed face of the n+ layer 13 by photolithography. After evacuation to a high vacuum of the order of $10^{-4}$ Pa or less, a vanadium (V) film about 200 Å thick and an Al film about 1.8 μm thick were formed by evaporation. Then, the photo resist was removed. As a result, the negative electrode 20B was formed on the exposed face of the n+ layer 13.

(2) Then, a photo resist was applied onto a surface evenly and then an electrode-forming portion of the photo resist on the p-type contact layer 19 was removed by photolithography so that a window portion was formed.

(3) After evacuation to a high vacuum of the order of $10^{-4}$ Pa or less, a Co film about 15 Å thick was formed on the photo resist and the exposed portion of the p-type contact layer 19 and an Au film about 60 Å thick was further formed on the Co film by an evaporation apparatus.

(4) Then, the sample was taken out from the evaporation apparatus and the Co and Au films deposited on the photo resist were removed by a lift-off method so that the light-transparency positive electrode 20A was formed on the p-type contact layer 19.

(5) Then, to form a bonding-purpose electrode pad 21 on a part of the light-transparency positive electrode 20A, a photo resist was applied evenly and a window was formed in the electrode pad 21-forming portion of the photo resist. Then, a film about 1.5 μm thick, which was made of a combination of either Co or Ni, Au and Al or made of an alloy thereof, was formed by evaporation. A portion of the film, which was deposited on the photo resist and which was made of a combination of either Co or Ni, Au and Al or made of an alloy thereof, was removed by a lift-off method in the same manner as in the step (4) to thereby form an electrode pad 21.

(6) Then, the atmosphere for the sample was evaluated by a vacuum pump and an $O_2$ gas was supplied to thereby set a pressure of 3 Pa. In this condition, a process for alloying the p-type contact layer 19 with the positive electrode 20A and a process for alloying the n+ layer 13 with the negative electrode 20B were performed at an atmospheric temperature of about 550° C. by heating for about 3 minutes.

Thus, the light-emitting device 100 was formed.

With respect to a group III nitride compound semiconductor light-emitting device for emitting green light in a main wavelength range of from 510 nm to 530 nm, experiment has shown that relatively high light intensity is exhibited when the thickness of the p-type clad layer 18 is in a range of from 180 Å to 500 Å. More preferably, the thickness of the p-type clad layer 18 is in an optimum range of from 240 Å to 360 Å. When the thickness is in the optimum range, the highest light emission output can be obtained.

With respect to a group III nitride compound semiconductor light-emitting device for emitting blue light in a main wavelength range of from 460 nm to 475 nm, experiment has shown that relatively high light intensity is exhibited when the thickness of the p-type clad layer 18 is in a range of from 90 Å to 390 Å. More preferably, the thickness of the p-type clad layer 18 is in an optimum range of from 120 Å to 300 Å. When the thickness is in the optimum range, the highest light emission output can be obtained.

The composition ratio x of aluminum (Al) in the p-type clad layer 18 made of p-type doped $Al_xGa_{1-x}N$ is preferably in a range of from 0.10 to 0.14. If x is smaller than 0.10, the light emission output is lowered because it is difficult to confine carriers in the light-emitting layer. If x is larger than 0.14, the light emission output is also lowered because stress applied to the light-emitting layer increases in accordance with the difference between lattice constants of crystals.

Although the above embodiment has shown the case where the light-emitting layer 16 in the light-emitting device 100 has a structure with two MQW cycles, the number of cycles in the light-emitting layer is not particularly limited. That is, the present invention can be applied to a group III nitride compound semiconductor light-emitting device with any number of cycles.

Further, each of layers such as the barrier layers, the well layers, the clad layers, the contact layer, etc. may be made of quaternary, ternary or binary $Al_xGa_yIn_{1-x-y}N$ ($0 \leq x \leq 1$, $0 \leq y \leq 1$) of an optional crystal mixture ratio.

Although the above embodiment further has shown the case where Mg is used as p-type impurities, the invention can be applied also to the case where a group II element such as beryllium (Be), zinc (Zn), or the like, is used as the p-type impurities.

Further, the present invention can be applied to photodetectors as well as light-emitting devices.

This invention is not limited to the above description of the mode for carrying out the invention and embodiments thereof at all, and includes various modifications that can be conceived by those skilled in the art without departing from the scope of the claims.

What is claimed is:

1. A group III nitride compound semiconductor light-emitting device, comprising:
   a light-emitting layer of a multilayer quantum well structure comprising alternately laminated well layers and barrier layers;
   an n-type clad layer being in contact with said light-emitting layer; and
   an intermediate layer being in contact with said n-type clad layer at one face thereof and an n-type contact layer at another face thereof,
   wherein said n-type clad layer is made thicker than each of said barrier layers, and
   wherein said intermediate layer comprises $In_xGa_{1-x}N$, where (0<x<1).

2. A group III nitride compound semiconductor light-emitting device according to claim 1, wherein said intermediate layer comprises $In_xGa_{1-x}N$, where (0.01<x<0.05).

3. The semiconductor light-emitting device of claim 1, wherein a thickness of said well layer is approximately 30 Å and a thickness of said barrier layer is approximately 70 Å.

4. The semiconductor light-emitting device of claim 1, further comprising:
   a cap layer formed on said light-emitting layer, said cap layer being formed of a material substantially the same as said barrier layers; and
   a p-type clad layer formed on and contacting said cap layer.

5. The semiconductor light-emitting device of claim 4, wherein a thickness of said p-type clad layer is in a range of approximately 180 Å to 500 Å, and a light emitted comprises green light in a wavelength range of approximately 510 nm to 530 nm.

6. The semiconductor light-emitting device of claim 5, wherein said thickness of said p-type clad layer is in a range of approximately 240 Å to 360 Å.

7. The semiconductor light-emitting device of claim 4, wherein a thickness of said p-type clad layer is in a range of approximately 90 Å to 390 Å, and a light emitted comprises blue light in a wavelength range of approximately 460 nm to 475 nm.

8. The semiconductor light-emitting device of claim 7, wherein said thickness of said p-type clad layer is in a range of approximately 120 Å to 300 Å.

9. The semiconductor light-emitting device of claim 4, wherein said p-type clad layer comprises p-type doped $Al_xGa_{1-x}N$, where x ranges from approximately 0.10 to 0.14.

10. The group III nitride compound semiconductor light-emitting device of claim 1, further comprising:

a cap layer in contact with said light-emitting layer on a side of said light-emitting layer opposite to that contacting said n-type clad layer, said cap layer being formed of a material substantially the same as said barrier layers.

11. A group III nitride compound semiconductor light-emitting device according to claim 10, wherein said n-type clad layer, said cap layer, and said barrier layers comprise GaN.

12. A group III nitride compound semiconductor light-emitting device according to claim 1, wherein a thickness of said n-type clad layer is in a range of 100 Å to 500 Å.

13. A group III nitride compound semiconductor light-emitting device according to claim 1, wherein said n-type clad layer is formed of a material substantially the same as said barrier layers.

14. The group III nitride compound semiconductor light-emitting device of claim 13, wherein said n-type clad layer and said barrier layers comprise GaN.

15. A group III nitride compound semiconductor light-emitting device according to claim 1, wherein said intermediate layer consists of $In_xGa_{1-x}N$, where (0<x<1).

16. A group III nitride compound semiconductor light-emitting device (LED) having enhanced color purity, comprising:

a light-emitting layer of a multilayer quantum well structure comprising alternately laminated well layers and barrier layers;

an n-type clad layer being in contact with said light-emitting layer on a first surface;

a cap layer being in contact with said light-emitting layer on a second surface opposite said first surface; and an intermediate layer being in contact with said n-type clad layer at one face thereof an an n-type contact layer at another face thereof, wherein said n-type clad layer, said cap layer and each of said barrier layers are formed of a substantially same material, thereby providing an enhanced color purity of light emitted from said light emitting layer and wherein said intermediate layer comprises $In_xGa_{1-x}N$, where (0<x<1).

17. The LED of claim 16, wherein said substantially same material comprises GaN.

18. The LED of claim 16, further comprising:

a p-type clad layer on said cap layer, said p-clad layer having a thickness selected from a range of thickness that optimizes an intensity of said color.

19. The LED of claim 18, wherein said color comprises a green light in a main wavelength range of approximately 510 nm to 530 nm and said range of thickness of said p-type clad layer is approximately 180 Å to 500 Å.

20. The LED of claim 19, wherein said range of thickness is approximately 240 Å to 360 Å.

21. The LED of claim 19, wherein said color comprises a blue light in a main wavelength range of approximately 460 nm to 475 nm and said range of thickness of said p-type clad layer is approximately 90 Å to 390 Å.

22. The LED of claim 21, wherein said range of thickness is approximately 120 Å to 300 Å.

23. The LED of claim 18, wherein said p-type clad layer comprises a p-type doped $Al_xGa_{1-x}N$, wherein $0.10 \leq x \leq 0.14$.

24. The LED of claim 16, said n-type clad layer is made thicker than each of said barrier layers and a thickness of said n-type clad layer is in a range of 100 Å to 500 Å.

25. The LED of claim 16, wherein $0.01 \leq x \leq 0.05$.

26. A group III nitride compound semiconductor light-emitting device according to claim 16, wherein said intermediate layer consists of $In_xGa_{1-x}N$, where (0<x<1).

* * * * *

UNITED STATES PATENT AND TRADEMARK OFFICE
CERTIFICATE OF CORRECTION

PATENT NO. : 6,861,663 B2
DATED : March 1, 2005
INVENTOR(S) : Katsuhisa Sawazaki et al.

It is certified that error appears in the above-identified patent and that said Letters Patent is hereby corrected as shown below:

<u>Title page,</u>
Item [73], Assignee, should read as follows:
-- Toyoda Gosei Co., Ltd.
Nishikasugai-gun, Japan --

Signed and Sealed this

Twenty-fourth Day of May, 2005

JON W. DUDAS
*Director of the United States Patent and Trademark Office*